(12) United States Patent
Alford

(10) Patent No.: US 7,003,963 B2
(45) Date of Patent: Feb. 28, 2006

(54) COOLING OF RECEIVE COIL IN MRI SCANNERS

(75) Inventor: Neil McNeill Alford, London (GB)

(73) Assignee: South Bank University Enterprises Ltd., London (GB)

( * ) Notice: Subject to any disclaimer, the term of this patent is extended or adjusted under 35 U.S.C. 154(b) by 0 days.

(21) Appl. No.: 10/415,322

(22) PCT Filed: Oct. 25, 2001

(86) PCT No.: PCT/GB01/04720

§ 371 (c)(1),
(2), (4) Date: Apr. 28, 2003

(87) PCT Pub. No.: WO02/35164

PCT Pub. Date: May 2, 2002

(65) Prior Publication Data

US 2004/0020218 A1    Feb. 5, 2004

(30) Foreign Application Priority Data

Oct. 26, 2000    (GB)    ................................ 0026145

(51) Int. Cl.
*F25B 9/00*    (2006.01)

(52) U.S. Cl. .......................................... 62/6; 62/259.2
(58) Field of Classification Search ................ 165/185; 62/6, 259.2
See application file for complete search history.

(56) References Cited

U.S. PATENT DOCUMENTS

| | | | | |
|---|---|---|---|---|
| 5,028,989 A | * | 7/1991 | Naganuma et al. | 257/714 |
| 5,140,298 A | * | 8/1992 | Gordon et al. | 338/226 |
| 5,495,889 A | * | 3/1996 | Dubelloy | 165/104.33 |
| 5,508,613 A | * | 4/1996 | Kotsubo et al. | 324/318 |
| 5,913,888 A | * | 6/1999 | Steinmeyer et al. | 62/51.1 |
| 5,966,944 A | * | 10/1999 | Inoue et al. | 62/51.1 |
| 6,184,504 B1 | * | 2/2001 | Cardella | 219/513 |
| 6,332,324 B1 | * | 12/2001 | Saho et al. | 62/51.1 |

* cited by examiner

*Primary Examiner*—William C. Doerrler
(74) *Attorney, Agent, or Firm*—Anthony R. Barkume, P.C.

(57) ABSTRACT

Equipment for cooling an HTS receive coil (4) in an MRI scanner to a temperature below the transition temperature of the HTS comprises a refrigeration unit such as a Stirling cooler (1) the cold head (2) of which is connected by a non-metallic thermally conductive rod (3) to the receive coil (4).

12 Claims, 1 Drawing Sheet

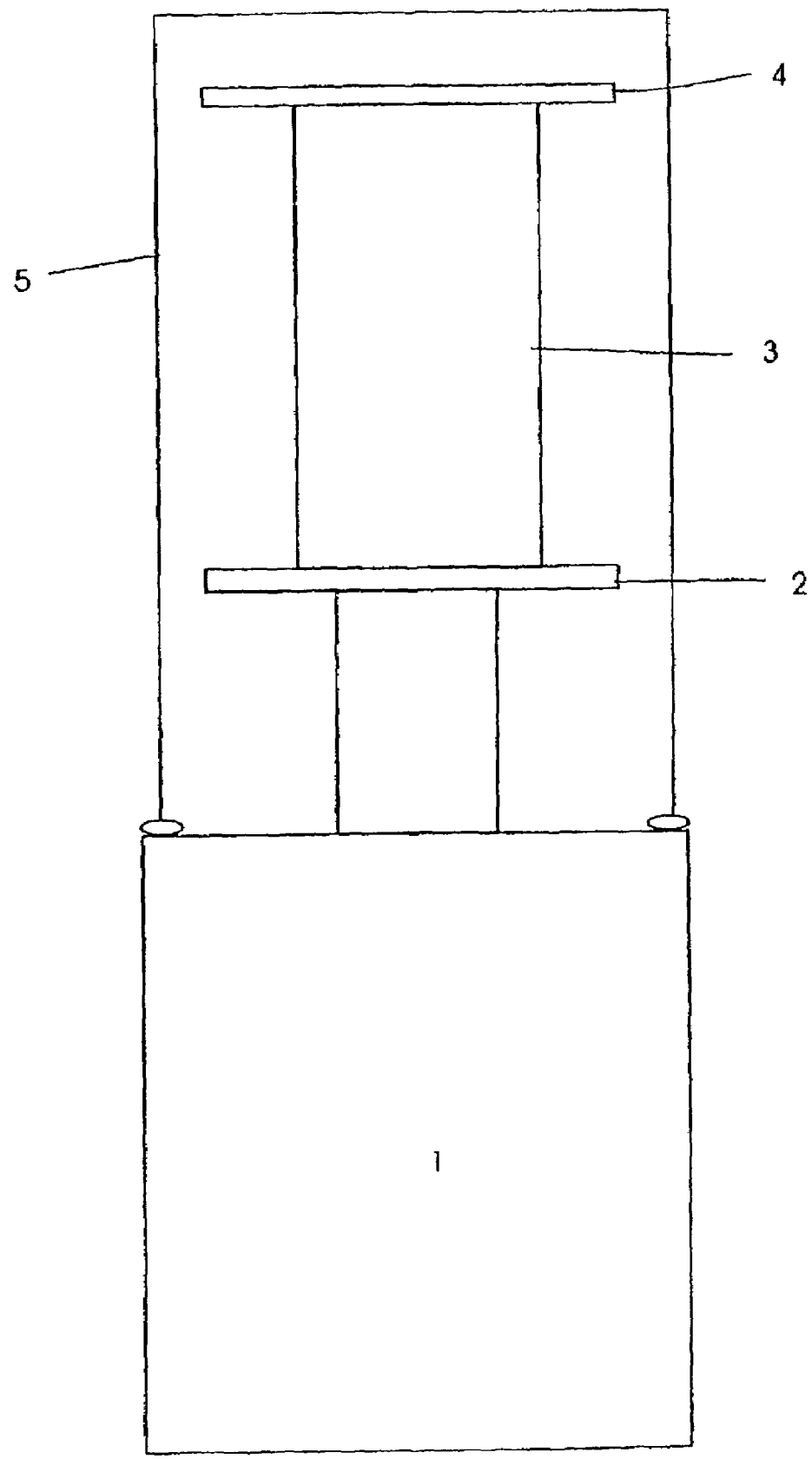

COOLING OF RECEIVE COIL IN MRI SCANNERS

The present invention relates to equipment and a method for cooling objects particularly the receive coil in MRI scanners.

Magnetic Resonance Imaging (MRI) is a powerful and versatile diagnostic technique which is widely used for carrying scans of the brain and the whole body. The growth of demand for MRI outstrips the supply as MRI is the only acceptable way of obtaining certain images, e.g. of the spine and brain etc., and the flexibility of MRI has led to new applications, e.g. interventional imaging. In addition there is growing concern at the use of CT and other X-ray based techniques with the consequent radiation hazard to patient and staff.

Although MRI is a powerful technique, the equipment required suffers a number of problems such as the very high capital cost of a machine, which can be in excess of £0.5 to £1 million for a basic to mid to high field scanner. The scanner has high running and operation costs due to the use of liquid helium and requires highly qualified staff such as radiologists and technicians, it also has high servicing costs, high space requirement due to the use of magnetic fringing fields and has compatibility problems with other equipment (e.g. life support and monitoring equipment) due to the use of high magnetic fields and the restricted 'patient space' can lead to claustrophobia in some patients and limited patient access.

MRI relies on the use of nuclear magnetic resonance which simplistically involves aligning hydrogen nuclei in a magnetic field, exciting them with a radio-frequency pulse and detecting a weak radio-frequency (rf) signal; the rf signal is detected by use of a "receive coil". This is essentially a sensitive antennae which, in conventional MRI machines, is usually made from a metal such as copper and is operated at ambient temperature (around 300K).

To make imaging possible the signal to noise ratio (SNR) must be increased to an acceptable level. In conventional scanners this has been achieved by increasing the magnetic field, which increases the signal. The magnetic field must also be very uniform and stable over the imaging area. This has led to machines which use high magnetic fields e.g. 1 Tesla or greater and requires the use of superconducting magnets.

The method and equipment of the present invention could be used with advantage to cool normal metal coils hence leading to increases in the conductivity of the normal metal receive antenna and hence improvements in signal to noise performance. However, it is in connection with cooling superconducting MRI receive coils that the greatest use of the invention is expected.

It has been shown that reducing the temperature of a copper receive coil improves its sensitivity and using a superconductor receive coil improves it further because it has a much lower resistance than copper. The discovery of the so-called high temperature superconductors (HTS) enables the temperature of operation to be brought to the realm where it becomes practically and economically feasible to take advantage of this property. The HTS superconductors possess transition temperatures above liquid nitrogen temperatures, 77K e.g. $YBa_2Cu_3O_x$ becomes superconducting at 92 K, $(Bi,Pb)_2Sr_2Ca_3Cu_3O_x$ has a transition at 105K. $TlBa_2Ca_2Cu_3O_x$, a transition at 115 K and $HgBa_2Ca_2Cu_3O_x$ a transition of 135K under pressure. These materials can thus be used at liquid nitrogen temperatures. Imaging has been carried out using HTS receive coils which have been cooled with liquid nitrogen and is described in the article by A S Hall, N Alford, T W Button. D J Gilderdale, K A Gehring and I R Young "Use of High Temperature Superconductor in a Receiver Coil for Magnetic Resonance Imaging". (Magnetic Resonance in Medicine 20, pps. 340–343, 1991). The cooling of the coils was performed using a liquid cryogen such as liquid nitrogen. This is disadvantageous under certain circumstances for example in remote areas where access to liquid cryogens on a regular basis is problematic.

We have devised apparatus which avoids completely the need to use liquid cryogens and cools the receive coil with a compact refrigerator. The use of a refrigerator had to overcome several problems as, under normal operation, the object to be cooled is placed directly onto the cold head, a radiation shield is placed over the object to prevent thermal loss and a vacuum jacket is then placed over the assembly, the object can then be cooled to a few degrees above absolute zero.

However, in use with a receive coil this is not possible as the receive coil cannot be placed directly on the cold head, because the metallic construction of the cooler will interfere with the signal to produce artefacts in the image or the NMR signal. It is also not possible to use an enclosed radiation shield because the NMR signal cannot then be detected by the receive coil, this means that, to use a cooler with a receive coil, the receive coil would need to be positioned at some distance from the cold head; the precise distance would depend on several factors such as size and shape of the coil, the intensity of the background magnetic field etc. In order to overcome the problem of cooling the receive coil at some distance from the cold head, a ferrous metal thermal conductor could not be used because ferrous metals are attracted by magnetic fields, nor could a non-ferrous metal be used because, even though non-ferrous metals are not attracted by magnetic fields the induced currents which would be set up within the metal would interfere with the signal.

We have found that there are thermally conductive non metallic compounds which could be used as a thermal conductor which overcome these problems.

According to the invention there is provided equipment for cooling an object such as the receive coil of a magnetic resonance image apparatus which equipment comprises a refrigeration unit having a cold head, a thermal conductor formed from a thermally conducting non-metallic compound, which thermal conductor is in thermal contact with the cold head and in which there are means for thermally contacting the thermal conductor with the object to be cooled.

In use, the refrigeration unit is operated so that the cold head is cooled to the required temperature and the thermal conductor is placed in thermal contact with the cold head and the receive coil whereby the receive coil is cooled.

The invention also provides a method for cooling the receive coil of MRI equipment in which method a refrigeration unit with a cold head is operated to cool the cold head and a non-metallic thermal conductor is placed in thermal contact with the cold head and the receive coil whereby the receive coil is cooled.

Coolers which could be used in the refrigeration unit include conventional coolers such as a Stirling cycle cooler, a Gifford McMahon cooler or a pulse tube cooler etc. These coolers contain a displacer which is linked to a regenerator and they are sometimes referred to as regenerative coolers. The displacer cycles the gas (e.g. helium) between the hot and cold ends of the refrigerator and maintains the proper phase relationship with the oscillating pressure generated by the oscillating piston (Thomas P Sheahen "Introduction to High Temperature Superconductivity" Plenum Press 1994 ISBN 0-306-4793-2). The net result is that this cools the cold bead of the cooler. The use of thermoelectric coolers is not precluded but their base temperature is considerably higher than the regenerative coolers described above.

The thermal conductor can be formed from a thermally conducting non-metallic compound, such as a thermally conductive ceramic. The thermal conductor can be made from known highly thermal conductive non metallic compounds such as for example, aluminium nitride, aluminium oxide, beryllium oxide, magnesium oxide, silicon carbide in sintered ceramic form or in single crystal form. Preferably the compound has a thermal conductivity of at least 10 W/m.K and preferably of at least 30 W/m. at room temperature (300K).

In general it is preferred for such compounds to be relatively pure (less than 5% impurities) as impurities within these compounds have a deleterious effect on the thermal conductivity of the compound.

It is also noted that at the temperatures of interest i.e. at cryogenic temperatures below e.g. 100K, the thermal conductivity of many materials is far greater in comparison with their room temperature thermal conductivity.

Thus for example, the approximate values for the thermal conductivity of sintered ceramic materials are shown in table 1 (extracted from "Specific Heat of nonmetallic solids" Y. S. Toulakian and E. H. Buyco Thermophysical properties of matter volume 5, IFI/Plenum New York, Washington 1970)

| Material | Thermal Conductivity W/m.K at 300 K | Thermal Conductivity W/m.K at 80 K |
| --- | --- | --- |
| $Al_2O_3$ | 30 | 150 |
| BeO | 200 | 1000 |
| SiC | 200 | 1000 |
| Diamond | 800 | 5000 |
| MgO | 40 | 1000 |

Preferably the receive coil is attached to a rod of the thermal conductor which is attached to the cold head of a closed cycle cooler. The rod is of a sufficient length to prevent the metallic cold-head and cooler body from interfering with the MRI signal. In order to prevent radiation losses the receive coil can be encapsulated in an insulator such as thin metallised Mylar, also known as superinsulation.

The invention enables an MRI receive coil to be cooled to low temperatures which gives enhanced performance of an MRI scanner enabling lower strength magnetic fields to be used without the need for liquid cryogens.

The invention is illustrated in the accompanying drawing which shows schematically an embodiment of the invention.

Referring to the drawing a closed cycle cooler such as a Stirling cycle cooler has a cold head (2) which is cooled by the cooler. Attached to the cold head (2) is a thermally conductive non-metallic rod (3). Attached to the rod (3) is the object to be cooled e.g. a receive coil. The cold head, thermally conductive rod and object to be cooled are surrounded by a vacuum jacket (5).

In use the cooler (1) is operated which cools the cold head (2) and the object (4) is subsequently cooled by means of the rod (3). Even in the presence of the very strong magnetic fields associated with MRI a receive coil operates effectively.

The invention is further described in the Examples.

EXAMPLES

Example 1

A rod of aluminium oxide 150 mm in length and 25 mm diameter was attached to the cold head of a Stirling cycle cooler. A receive coil composed of a superconducting $YBa_2Cu_3O_x$ material was deposited on a 3 mole percent Y-stabilised zirconia 100 mm×100 mm×1 mm square substrate. The substrate was placed on top of the dense aluminium oxide rod with composition<5% impurities. The substrate achieved a temperature of 70K with 5W of cooling power. This was sufficient to cool the superconductor below its superconducting transition temperature.

Example 2

The procedure of Example 1 was followed except that the substrate was a 100 mm×100 mm×1 mm substrate composed of aluminium oxide. Again the temperature reached by the substrate was less than 70K.

Example 3

The same procedure as Example 2 was applied to a substrate composed of aluminium oxide upon which is printed a silver coil. The temperature reached was less than 70K.

Example 4

The same procedure as in Example 2 was applied to a 25 mm×25 mm×1 mm square substrate composed of polymer circuit board material upon which was printed a copper coil. The temperature reached was less than 70K.

The invention claimed is:

1. Equipment for cooling the receive coil of a nuclear magnetic resonance image instrument which equipment comprises a refrigeration unit having a cold head, a thermal conductor formed from a thermally conducting ceramic with a thermal conductivity of at least 10 W/m.K which thermal conductor is in direct thermal contact with the cold head and in which there are means for thermally contacting the thermal conductor with the receive coil of a nuclear magnetic resonance image instrument.

2. Equipment according to claim 1 in which the conductor is formed from a thermally conducting ceramic with a thermal conductivity of at least 30 W/m.K at 300K.

3. Equipment according to claim 1 in which the receive coil is made from a high temperature superconductor.

4. Equipment according to claim 1 in which the thermal conductor is made from a compound selected from aluminium nitride, aluminium oxide, beryllium oxide, magnesium oxide or silicon carbide in sintered ceramic form.

5. Equipment according to claim 1 in which the thermal conductor is made from a compound selected from aluminium nitride, aluminium oxide, beryllium oxide, magnesium oxide or silicon carbide in single crystal form.

6. Equipment as claimed in claim 1 in which the receive coil is made from $YBa_2Cu_3O_x$.

7. Equipment as claimed in claim 1 in which the refrigeration unit incorporates a Stirling cycle cooler.

8. Equipment for cooling the receive coil of a nuclear magnetic resonance image instrument which equipment comprises a refrigeration unit incorporating a Stirling cycle cooler having a cold head, a thermal conductor formed from a thermally conducting ceramic which thermal conductor is in direct thermal contact with the cold head and in which there are means for thermally contacting the thermal conductor with the receive coil of a nuclear magnetic resonance image instrument.

9. Equipment according to claim 8 in which the thermal conductor is made from a compound selected from aluminium nitride, aluminium oxide, beryllium oxide, magnesium oxide or silicon carbide in sintered ceramic form.

10. Equipment according to claim 8 in which the thermal conductor is made from a compound selected from aluminium nitride, aluminium oxide, beryllium oxide, magnesium oxide or silicon carbide in single crystal form.

11. Equipment as claimed in claim 8 in which the receive coil is made from $YBa_2Cu_3O_x$.

12. A method for cooling the receive coil of an MRI scanner in which method a refrigeration unit with a cold head is operated to cool the cold head and a non-metallic thermal conductor formed from a thermally conducting ceramic with a thermal conductivity of at least 10 W/m.K is placed in direct thermal contact with the cold head and the receive coil whereby the receive coil is cooled.

* * * * *